US012580158B2

(12) United States Patent
Baek et al.

(10) Patent No.: US 12,580,158 B2
(45) Date of Patent: Mar. 17, 2026

(54) PLASMA PROCESSING APPARATUS, SUBSTRATE BONDING SYSTEM INCLUDING THE SAME, AND SUBSTRATE BONDING METHOD USING THE SAME

(71) Applicant: SAMSUNG ELECTRONICS CO., LTD., Suwon-si (KR)

(72) Inventors: Inhwa Baek, Hwaseong-si (KR); Donggap Shin, Seoul (KR); Yongin Lee, Seoul (KR); Se-Hoon Jang, Hwaseong-si (KR); Youngho Kim, Gwangju-si (KR); Ho Kim, Hwaseong-si (KR); Seungdae Seok, Seongnam-si (KR); Siwoong Woo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 17/865,675

(22) Filed: Jul. 15, 2022

(65) Prior Publication Data

US 2023/0215698 A1    Jul. 6, 2023

(30) Foreign Application Priority Data

Jan. 3, 2022    (KR) ........................ 10-2022-0000407

(51) Int. Cl.
*H01J 37/32*    (2006.01)
*H01L 21/02*    (2006.01)
(Continued)

(52) U.S. Cl.
CPC .... *H01J 37/3244* (2013.01); *H01J 37/32532* (2013.01); *H01J 37/32862* (2013.01); *H01L 21/02057* (2013.01); *H01L 21/67051* (2013.01); *H01L 21/67201* (2013.01); *H01L 21/67207* (2013.01); *H01L 21/6833* (2013.01)

(58) Field of Classification Search
None
See application file for complete search history.

(56) References Cited

U.S. PATENT DOCUMENTS 5,900,103 A * 5/1999 Tomoyasu .......... C23C 16/4405
                                                  204/298.34
7,261,793 B2    8/2007 Chen et al.
(Continued)

FOREIGN PATENT DOCUMENTS

JP        4830290 B2    12/2011
JP    2012-175043 A      9/2012
(Continued)

*Primary Examiner* — Christopher T Schatz
(74) *Attorney, Agent, or Firm* — Sughrue Mion, PLLC

(57) ABSTRACT

Plasma processing apparatuses, substrate bonding systems, and substrate bonding methods are provided. The plasma processing apparatus includes a plasma process chamber that includes a process space, a load-lock chamber connected to the process space, a first vacuum pump that adjusts a pressure of the load-lock chamber, a process gas supply that supplies the process space with a process gas, and an $H_2O$ supply that supplies the process space with $H_2O$. The plasma process chamber includes a chuck that supports a substrate and a plasma electrode to which a radio-frequency (RF) power is applied.

8 Claims, 14 Drawing Sheets

(51) Int. Cl.
  *H01L 21/67*    (2006.01)
  *H01L 21/683*   (2006.01)

(56)      References Cited

U.S. PATENT DOCUMENTS

| | | |
|---|---|---|
| 7,686,912 B2 | 3/2010 | Suga et al. |
| 10,573,550 B2 | 2/2020 | Kweskin |
| 10,580,752 B2 | 3/2020 | Yamauchi |
| 10,790,260 B2 | 9/2020 | Liu et al. |
| 10,886,252 B2 | 1/2021 | Peng et al. |
| 2006/0032582 A1* | 2/2006 | Chen ..................... H01L 24/83 |
| | | 257/E21.505 |
| 2008/0102603 A1 | 5/2008 | Kobayashi et al. |
| 2010/0122762 A1 | 5/2010 | George |
| 2011/0129986 A1 | 6/2011 | Libralesso et al. |
| 2013/0032272 A1* | 2/2013 | Broekaart ......... H01L 21/67092 |
| | | 156/60 |
| 2018/0327283 A1* | 11/2018 | Pemen ................... B01J 19/088 |
| 2019/0216970 A1* | 7/2019 | Eide .......................... A61L 9/12 |

FOREIGN PATENT DOCUMENTS

| | | | |
|---|---|---|---|
| JP | 5661612 B2 | 1/2015 |
| JP | 5718235 B2 | 5/2015 |
| JP | 6448858 B2 | 1/2019 |
| JP | 6473908 B2 | 2/2019 |
| JP | 6544722 B2 | 7/2019 |

* cited by examiner

FIG. 6

Substrate bonding method —— S

Plasma-treating first substrate —— S1

Loading first substrate on plasma processing apparatus —— S11

Supplying plasma processing apparatus with $H_2O$ —— S12

Supplying process gas onto first substrate —— S13

Generating plasma on first substrate —— S14

Cleaning first substrate —— S2

Supplying cleaning solution onto first substrate —— S21

Rotating first substrate —— S22

Bonding second substrate onto first substrate —— S3

Placing first substrate on lower chuck —— S31

Placing second substrate on upper chuck —— S32

Allowing second substrate to contact top surface of first substrate —— S33

FIG. 11

PLASMA PROCESSING APPARATUS, SUBSTRATE BONDING SYSTEM INCLUDING THE SAME, AND SUBSTRATE BONDING METHOD USING THE SAME

CROSS-REFERENCE TO RELATED APPLICATION

This U.S. non-provisional application claims priority under 35 U.S.C § 119 to Korean Patent Application No. 10-2022-0000407 filed on Jan. 3, 2022 in the Korean Intellectual Property Office, the disclosure of which is hereby incorporated by reference in its entirety.

BACKGROUND

Embodiments of the present disclosure relate to a plasma processing apparatus, a substrate bonding system including the same, and a substrate bonding method using the same, and more particularly, to a plasma processing apparatus capable of reducing a process time and increasing bonding efficiency, a substrate bonding system including the same, and a substrate bonding method using the same.

Various processes may be performed to fabricate a semiconductor device. For example, the semiconductor device may be fabricated through photolithography, etching, deposition, and test processes performed on a substrate. Alternatively, a direct bonding process may be executed in which a substrate and a substrate are directly bonded to each other for fabricating the semiconductor device. Before the two substrates are bonded to each other, it may be required to perform a certain treatment on a surface of the substrate. Therefore, a plasma surface treatment may be fulfilled on the substrate.

SUMMARY

Some embodiments of the present disclosure provide a plasma processing apparatus in which a chamber is maintained in a vacuum state to reduce a process time, a substrate bonding system including the same, and a substrate bonding method using the same.

Some embodiments of the present disclosure provide a plasma processing apparatus capable of increasing bonding efficiency between substrates, a substrate bonding system including the same, and a substrate bonding method using the same.

Some embodiments of the present disclosure provide a plasma processing apparatus capable of cutting cost, a substrate bonding system including the same, and a substrate bonding method using the same.

According to embodiments of the present disclosure, a plasma processing apparatus is provided. The plasma processing apparatus includes: a plasma process chamber that includes a process space; a load-lock chamber connected to the process space; a first vacuum pump configured to adjust a pressure of the load-lock chamber; a process gas supply configured to supply the process space with a process gas; and an $H_2O$ supply configured to supply the process space with $H_2O$, wherein the plasma process chamber includes: a chuck configured to support a substrate; and a plasma electrode to which a radio-frequency (RF) power is configured to be applied.

According to embodiments of the present disclosure, a substrate bonding system is provided. The substrate bonding system includes: a plasma processing apparatus; a cleaning apparatus that is configured to clean a substrate provided from the plasma processing apparatus; and a bonding apparatus that is configured to perform a direct bonding method that bonds two substrates to each other, wherein the plasma processing apparatus includes: a plasma process chamber that includes a process space; a load-lock chamber connected to the process space; a process gas supply configured to supply the process space with a process gas; and an $H_2O$ supply configured to supply the process space with $H_2O$.

According to embodiments of the present disclosure, a substrate bonding method is provided. The substrate bonding method includes: plasma-treating a first substrate; cleaning the first substrate; and bonding a second substrate onto the first substrate, wherein plasma-treating the first substrate includes: loading the first substrate into a plasma processing apparatus; supplying the plasma processing apparatus with $H_2O$; supplying a process gas onto the first substrate; and generating plasma on the first substrate.

Aspects of the present disclosure are not limited to the aspects mentioned above, and other aspects which have not been mentioned above will be clearly understood to those skilled in the art from the following description.

Details of other example embodiments are included in the description and drawings.

BRIEF DESCRIPTION OF DRAWINGS

FIG. 6 illustrates a flow chart showing a substrate bonding method according to some embodiments of the present disclosure.

FIG. 11 illustrates a fifth cross-sectional view showing the substrate bonding method according to the flow chart of FIG. 6.

DETAILED DESCRIPTION

Figure 1:
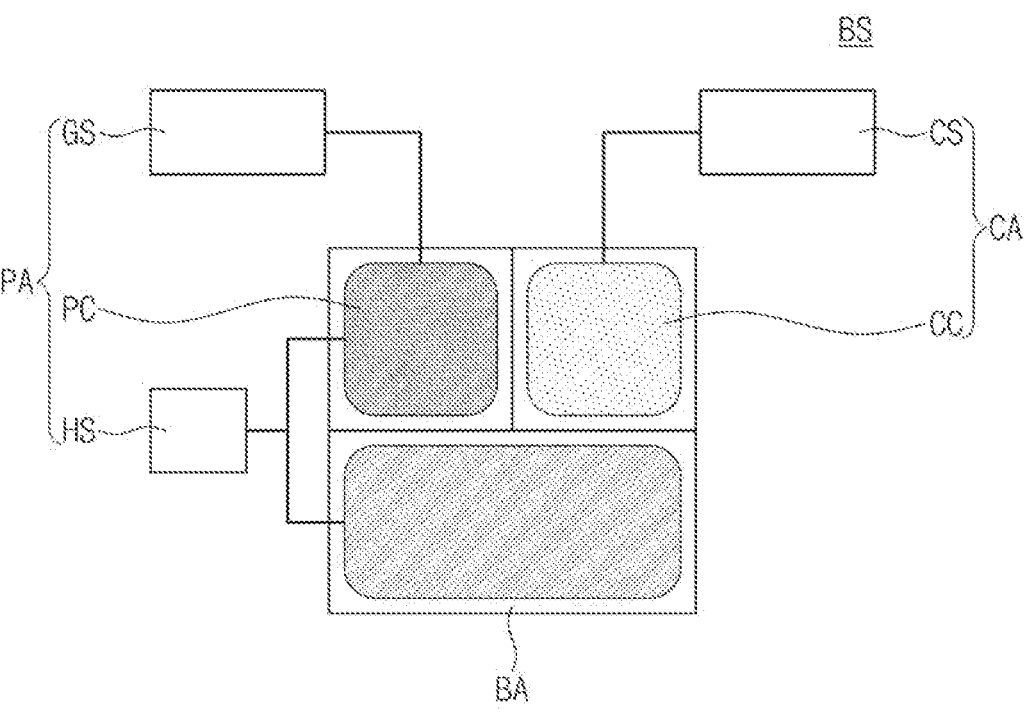
FIG. 1 illustrates a simplified schematic diagram showing a substrate bonding system according to some embodiments of the present disclosure.

The following will now describe some non-limiting example embodiments of the present disclosure with reference to the accompanying drawings. Like reference numerals may indicate like components throughout the description.

FIG. 1 illustrates a simplified schematic diagram showing a substrate bonding system according to some embodiments of the present disclosure.

Referring to FIG. 1, a substrate bonding system BS may be provided. The substrate bonding system BS may be a system in which two substrates are directly bonded to each other. For example, the substrate bonding system BS may mean a system for a direct bonding process. A wafer-level substrate may be bonded in the direct bonding process. For example, two wafers may be bonded to each other in the substrate bonding system BS. Embodiments of the present disclosure, however, are not limited thereto, and the substrate bonding system BS may be used to bond a chip onto a wafer or to bond a chip onto a chip. The substrate bonding system BS may include a plasma processing apparatus PA, a cleaning apparatus CA, and a bonding apparatus BA.

The plasma processing apparatus PA may perform a plasma treatment on a substrate. For example, a plasma treatment process may be performed in the plasma processing apparatus PA to active a hydroxyl group (—OH) on one surface of a substrate. The plasma processing apparatus PA may include a plasma process chamber PC, a process gas supply GS, and an $H_2O$ supply HS.

A substrate plasma treatment may be performed in the plasma process chamber PC. A vacuum state may be maintained in the plasma process chamber PC. A detailed description thereof will be further provided below.

The process gas supply GS may supply a process gas to the plasma process chamber PC. For example, the process gas supply GS may supply the plasma process chamber PC with a process gas such as nitrogen ($N_2$) or oxygen ($O_2$).

The $H_2O$ supply HS may supply the plasma process chamber PC with $H_2O$. The $H_2O$ supply HS may be connected to the plasma process chamber PC. In addition, the $H_2O$ supply HS may be connected to the bonding apparatus BA. The $H_2O$ supply HS may also supply the bonding apparatus BA with $H_2O$. In some embodiments, the $H_2O$ supply HS may supply $H_2O$-including air to the plasma process chamber PC and/or the bonding apparatus BA. Embodiments of the present disclosure, however, are not limited thereto, and the $H_2O$ supply HS may supply only $H_2O$. A detailed description thereof will be further provided below.

The cleaning apparatus CA may perform a cleaning process on a substrate. The cleaning apparatus CA may execute a cleaning process on a substrate that is unloaded from the plasma processing apparatus PA. For example, the cleaning apparatus CA may supply a substrate with a cleaning solution to clean a surface of the substrate. The cleaning apparatus CA may include a cleaning chamber CC and a cleaning solution supply CS.

A substrate may be disposed in the cleaning chamber CC. For example, the cleaning chamber CC may receive a substrate that is released from the plasma processing apparatus PA. A cleaning solution may be provided on the substrate in the cleaning chamber CC. In this sense, the cleaning chamber CC may be a wet chamber.

The cleaning solution supply CS may supply the cleaning chamber CC with a cleaning solution. The cleaning solution may include deionized water (DIW), but embodiments of the present disclosure are not limited thereto. The substrate in the cleaning chamber CC may be cleaned with the cleaning solution supplied from the cleaning solution supply CS.

The bonding apparatus BA may bond two substrates to each other. For example, the bonding apparatus BA may direct bond a wafer onto another wafer. Before a substrate is loaded into the bonding apparatus BA, the substrate may be sequentially introduced into the plasma processing apparatus PA and the cleaning apparatus CA.

With reference to FIGS. 2 to 5, the following will describe in detail each component of the substrate bonding system BS.

Figure 2:
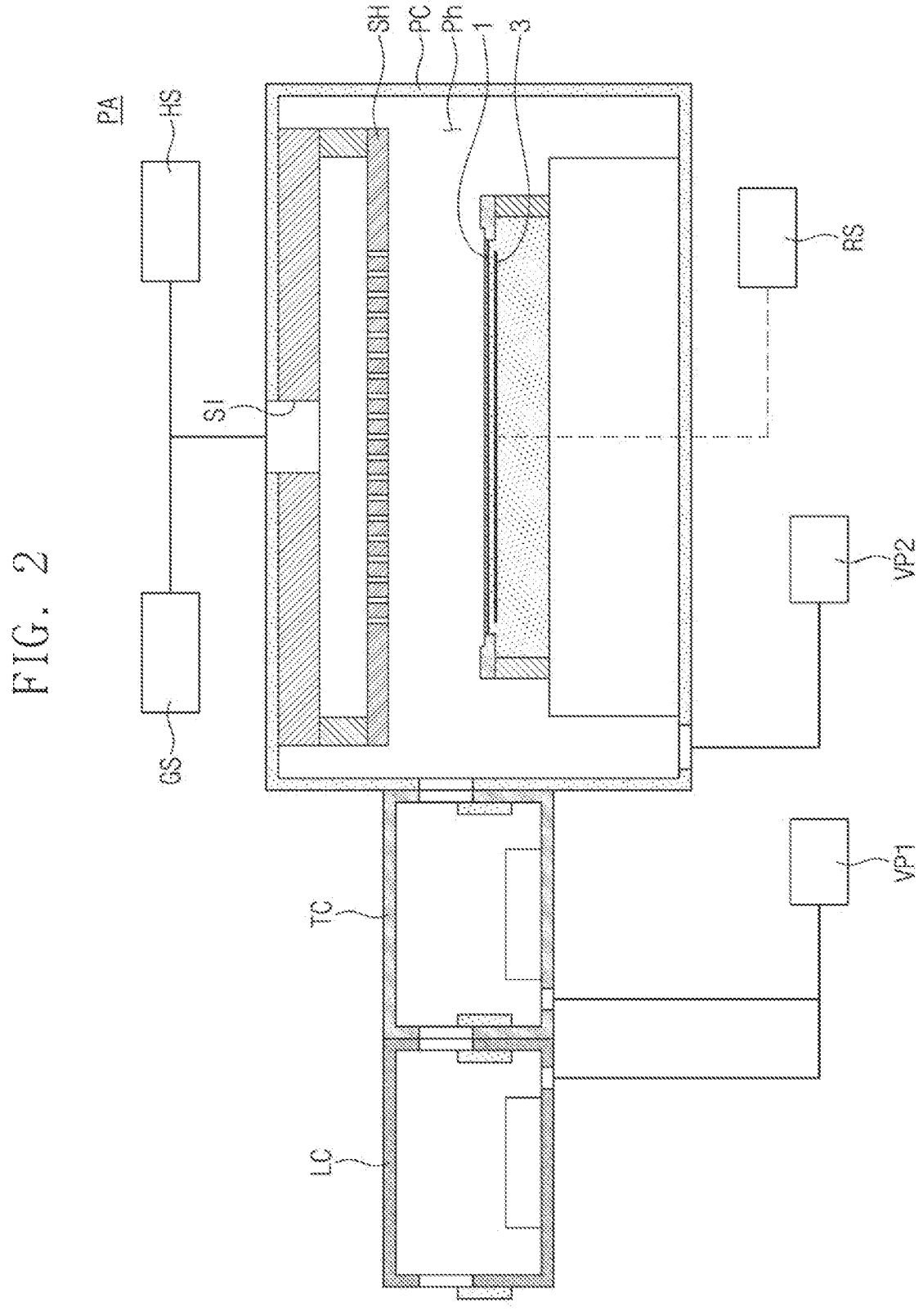
FIG. 2 illustrates a cross-sectional view showing a plasma processing apparatus according to some embodiments of the present disclosure.

FIG. 2 illustrates a cross-sectional view showing a plasma processing apparatus according to some embodiments of the present disclosure.

Referring to FIG. 2, the plasma processing apparatus PA may include a load-lock chamber LC, a transfer device TC, a first vacuum pump VP1, a plasma process chamber PC, a second vacuum pump VP2, a radio-frequency (RF) power apply unit RS, a process gas supply GS, and an $H_2O$ supply HS.

The load-lock chamber LC may be connected to the first vacuum pump VP1. The first vacuum pump VP1 may change an internal pressure of the load-lock chamber LC. For example, when a door of the load-lock chamber LC is opened to expose the load-lock chamber LC, the load-lock chamber LC may have an internal pressure similar to atmospheric pressure. When the door is closed and the first vacuum pump VP1 applies a vacuum pressure, the load-lock chamber LC may have a vacuum state therein. The load-lock chamber LC may be connected to the plasma process chamber PC. When the load-lock chamber LC is in a vacuum state, a substrate loaded into the load-lock chamber LC may be transferred to the plasma process chamber PC.

The transfer device TC may be positioned between the load-lock chamber LC and the plasma process chamber PC. The transfer device TC may allow a substrate to be transferred between the load-lock chamber LC and the plasma process chamber PC. The transfer device TC may be provided in the form of a chamber in a vacuum state. For example, the transfer device TC may include a vacuum state chamber positioned between the load-lock chamber LC and the plasma process chamber PC, and may also include a robot arm in the vacuum state chamber.

The first vacuum pump VP1 may be connected to the load-lock chamber LC. The first vacuum pump VP1 may apply an internal pressure into the load-lock chamber LC. Therefore, the load-lock chamber LC may have a vacuum state therein. A vacuum valve (not shown) may be provided between the first vacuum pump VP1 and the load-lock chamber LC. An open/close of the vacuum valve may control an vacuum pressure applied to the load-lock chamber LC. In addition, the first vacuum pump VP1 may also be connected to the transfer device TC. The first vacuum pump VP1 may allow the transfer device TC to maintain its vacuum state. A vacuum valve (not shown) may also be provided between the first vacuum pump VP1 and the transfer device TC.

The plasma process chamber PC may provide a process space Ph. The process space Ph may be connected to the load-lock chamber LC. An external substrate may be transferred through the load-lock chamber LC to the plasma process chamber PC. The process space Ph may be connected to the second vacuum pump VP2. The second vacuum pump VP2 may allow the process space Ph to maintain its vacuum state. The process space Ph may be connected through a fluid intake SI to one or more of the process gas supply GS and the $H_2O$ supply HS. The plasma process chamber PC may further include a chuck 1, a plasma electrode 3, and a showerhead SH.

The chuck 1 may have a plate shape that extends in a horizontal direction. A substrate may be loaded on the chuck 1. The chuck 1 may support and fix a substrate. For example, the chuck 1 may include an electrostatic chuck (ESC) that uses an electrostatic force to fix a substrate. Embodiments of the present disclosure, however, are not limited thereto, and the chuck 1 may include one or more of a vacuum chuck or a physical sticky chuck.

The plasma electrode 3 may generate an electric field on the chuck 1. For example, the plasma electrode 3 may generate an electric field in the process space Ph by using a radio-frequency (RF) power transferred from the RF power apply unit RS. Therefore, a portion of a process gas in the process space Ph may be converted into plasma. The plasma electrode 3 may include a conductive material. The plasma electrode 3 may have a plate shape that extends in a horizontal direction. The plasma electrode 3 may be positioned beneath the chuck 1, but embodiments of the present disclosure are not limited thereto.

The showerhead SH may be disposed upwardly spaced apart from the chuck 1. The showerhead SH may provide a plurality of distribution holes. The showerhead SH may be connected to the fluid intake SI.

The second vacuum pump VP2 may be connected to the process space Ph. The second vacuum pump VP2 may allow the process space Ph to maintain its vacuum state. It is shown and described that the first vacuum pump VP1 and the second vacuum pump VP2 are provided separately from each other, but embodiments of the present disclosure are not limited thereto. For example, one vacuum pump may adjust pressures of all of the load-lock chamber LC, the transfer device TC, and the plasma process chamber PC.

The RF power apply unit RS may apply an RF power to the plasma electrode 3. The RF power apply unit RS may be electrically connected to the plasma electrode 3. A conductive rod may be provided between the RF power apply unit RS and the plasma electrode 3.

The process gas supply GS may supply the process space Ph with a process gas. The process gas supply GS may include a process gas tank, a process gas passage, and a process gas valve.

The $H_2O$ supply HS may supply the process space Ph with $H_2O$. For example, the $H_2O$ supply HS may be connected to the fluid intake SI, thereby supplying the fluid intake SI with $H_2O$. The $H_2O$ introduced through the fluid intake SI may be distributed through the showerhead SH onto the chuck 1. Embodiments of the present disclosure, however, are not limited thereto, and the $H_2O$ supply HS may be connected to the process space Ph through an intake other than the fluid intake SI. The $H_2O$ supply HS will be further discussed in detail below.

Figure 3:
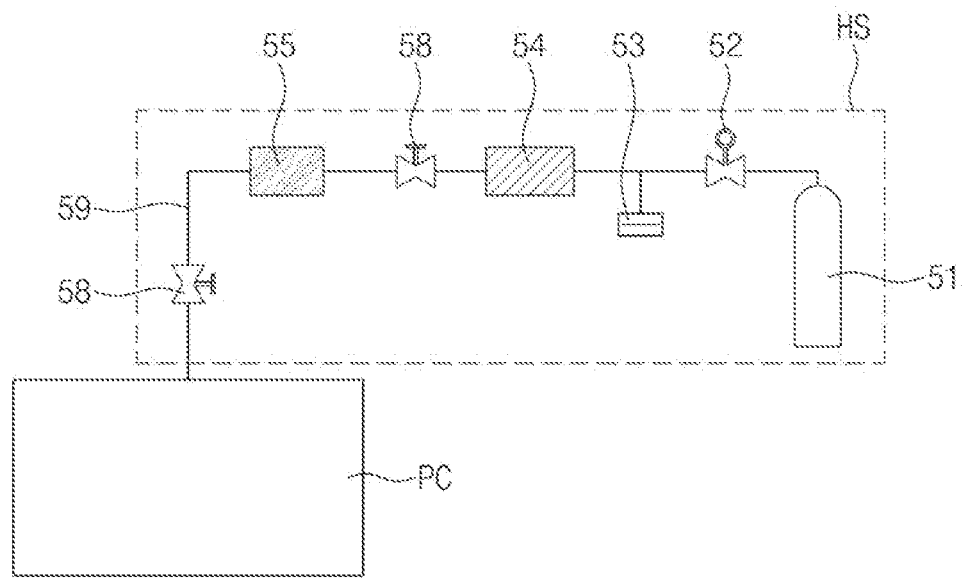
FIG. 3 illustrates a simplified schematic diagram showing an $H_2O$ supply according to some embodiments of the present disclosure.

FIG. 3 illustrates a simplified schematic diagram showing an $H_2O$ supply according to some embodiments of the present disclosure.

Referring to FIG. 3, the $H_2O$ supply HS may include an air supply device 51 (also referred to as an "air supply"), an air pipe 59, a regulator 52, a pressure sensor 53, a filter 54, a flow controller 55, and an air valve 58.

The air supply device 51 may supply air. For example, the air supply device 51 may be a temperature humidity air controller (THC) that adjusts temperature and humidity of air. When the air supply device 51 includes a temperature humidity air controller (THC), humidity of air may be controlled. It may thus be possible to control a supply amount of $H_2O$ by adjusting only a flow rate of air that is supplied to the plasma process chamber PC. Embodiments of the present disclosure, however, are not limited thereto, and the air supply device 51 may include a simple air tank and a compressor.

The air pipe 59 may connect the air supply device 51 to the plasma process chamber PC.

The regulator 52 may be positioned on the air pipe 59. The regulator 52 may control a pressure of air that is supplied to the plasma process chamber PC.

The pressure sensor 53 may detect a pressure in the air pipe 59. The regulator 52 may be feedback-controlled based on information about a pressure detected by the pressure sensor 53.

The filter 54 may be positioned on the air pipe 59. The filter 54 may filter foreign substances inside air that is supplied through the air pipe 59 to the plasma process chamber PC. The filtering action of the filter 54 may prevent introduction of foreign substance, such as particles, into plasma process chamber PC. The filter 54 may not filter $H_2O$. For example, the filter 54 may be a filter that allows $H_2O$ to pass therethrough. Therefore, $H_2O$ in air may be delivered to the plasma process chamber PC without being filtered.

The flow controller 55 may be positioned on the air pipe 59. The flow controller 55 may control a flow rate of air in the air pipe 59. The flow controller 55 may include a mass flow controller (MFC), but embodiments of the present disclosure are not limited thereto.

The air valve 58 may be positioned on the air pipe 59. An open/close of the air valve 58 may selectively interrupt supply of air to the plasma process chamber PC. The air valve 58 may be provided in plural.

Figure 4:
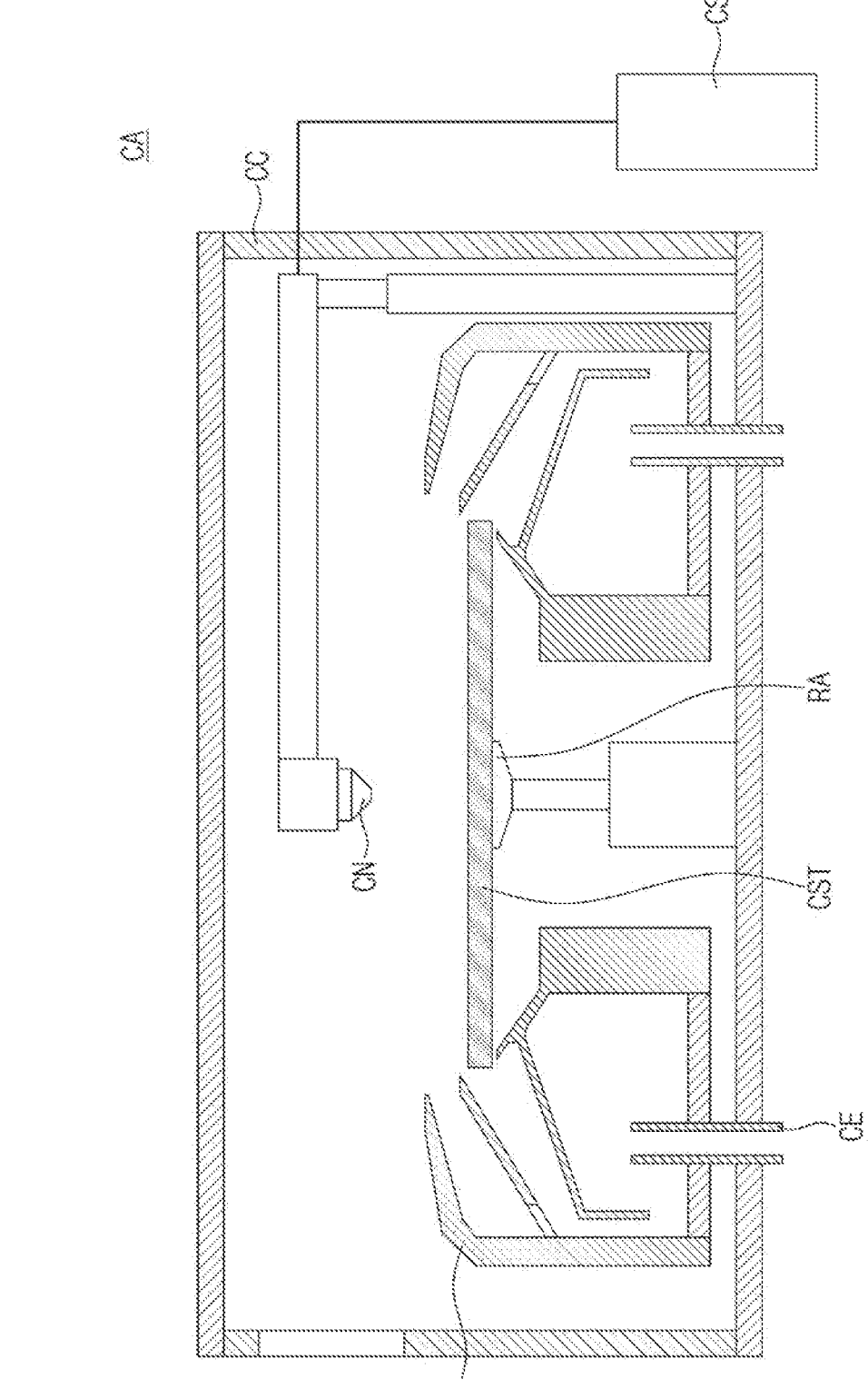
FIG. 4 illustrates a cross-sectional view showing a cleaning apparatus according to some embodiments of the present disclosure.

FIG. 4 illustrates a cross-sectional view showing a cleaning apparatus according to some embodiments of the present disclosure.

Referring to FIG. 4, the cleaning apparatus CA may include a cleaning chamber CC and a cleaning solution supply CS.

The cleaning chamber CC may include a stage CST, a rotational drive mechanism RA, a cleaning nozzle CN, a bowl B, and a cleaning exhaust CE.

The stage CST may support a substrate. A substrate may be cleaned while being supported on the stage CST.

The rotational drive mechanism RA may rotate a substrate. For example, the rotational drive mechanism RA may be configured such that the stage CST rotates about an axis thereof to cause the substrate to rotate in place.

The cleaning nozzle CN may be upwardly spaced apart from the stage CST. The cleaning nozzle CN may be connected to the cleaning solution supply CS. The cleaning nozzle CN may be supplied with a cleaning solution from the cleaning solution supply CS to spray the cleaning solution on the substrate on the stage CST.

The bowl B may be positioned outside the stage CST. The bowl B may receive a cleaning solution thrown outwardly from the stage CST to collect the cleaning solution into one side.

The cleaning exhaust CE may be positioned below the bowl B. The cleaning solution collected by the bowl B may be discharged through the cleaning exhaust CE.

The cleaning solution supply CS may be connected to the cleaning nozzle CN. The cleaning solution supply CS may supply the cleaning nozzle CN with a cleaning solution. The cleaning solution supply CS may include a cleaning solution tank and a cleaning pump.

Figure 5:
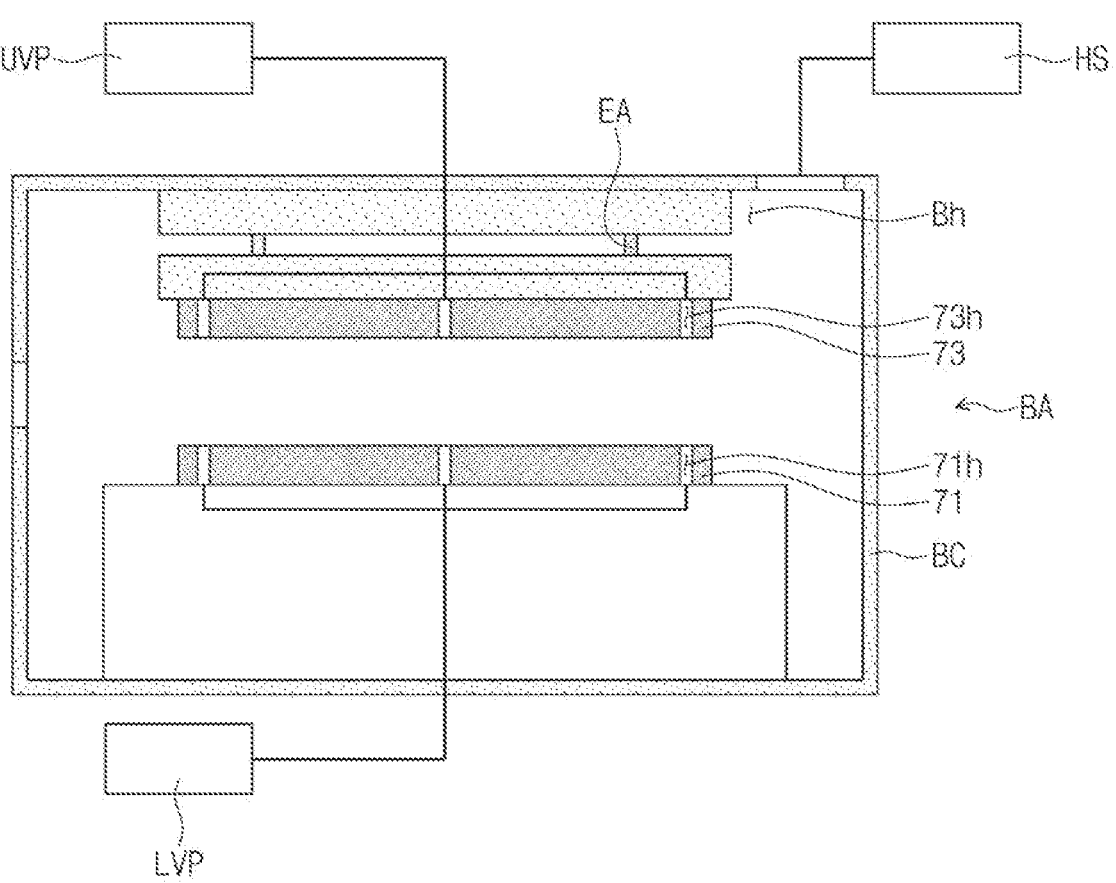
FIG. 5 illustrates a cross-sectional view showing a bonding apparatus according to some embodiments of the present disclosure.

FIG. 5 illustrates a cross-sectional view showing a bonding apparatus according to some embodiments of the present disclosure.

Referring to FIG. 5, the bonding apparatus BA may include a bonding chamber BC, a lower chuck 71, an upper chuck 73, a chuck elevation device EA, an upper vacuum pump UVP, and a lower vacuum pump LVP.

The bonding chamber BC may provide a bonding space Bh. In the bonding space Bh, a bonding between two substrates may be performed. The bonding space Bh may be connected to the H$_2$O supply HS. The bonding space Bh may be supplied with air from the H$_2$O supply HS. Therefore, temperature and humidity of the bonding space Bh may be controlled to a certain level.

The lower chuck 71 may support a substrate. The lower chuck 71 may provide a lower vacuum hole 71$h$. The lower vacuum hole 71$h$ may be connected to the lower vacuum pump LVP. The lower vacuum pump LVP may provide the lower vacuum hole 71$h$ with a vacuum pressure to fix a substrate onto the lower chuck 71. The lower vacuum hole 71$h$ may be provided in plural. The plurality of the lower vacuum hole 71$h$ may be spaced apart from each other in a horizontal direction. In this description below, unless otherwise specially stated, a single lower vacuum hole 71$h$ will be discussed in the interest of convenience.

The upper chuck 73 may support a substrate. The upper chuck 73 may be upwardly spaced apart from the lower chuck 71. For example, the upper chuck 73 may be disposed to face the lower chuck 71. The upper chuck 73 may provide an upper vacuum hole 73$h$. The upper vacuum hole 73$h$ may be connected to the upper vacuum pump UVP. The upper vacuum pump UVP may provide the upper vacuum hole 73$h$ with a vacuum pressure to fix a substrate onto the upper chuck 73. The upper vacuum hole 73$h$ may be provided in plural. The plurality of upper vacuum hole 73$h$ may be spaced apart from each other in a horizontal direction. In this description below, unless otherwise specially stated, a single upper vacuum hole 73$h$ will be discussed in the interest of convenience.

The chuck elevation device EA may move one or more of the lower chuck 71 and the upper chuck 73. For example, as illustrated in FIG. 5, the chuck elevation device EA may be connected to the upper chuck 73. The chuck elevation device EA may vertically move the upper chuck 73.

The upper vacuum pump UVP may be connected to the upper vacuum hole 73$h$. The upper vacuum pump UVP may provide the upper vacuum hole 73$h$ with a vacuum pressure.

The lower vacuum pump LVP may be connected to the lower vacuum hole 71$h$. The lower vacuum pump LVP may provide the lower vacuum hole 71$h$ with a vacuum pressure.

FIG. 6 illustrates a flow chart showing a substrate bonding method according to some embodiments of the present disclosure.

Referring to FIG. 6, a substrate bonding method S may be provided. The substrate bonding method S may be a method in which two substrates are bonded to each other by using the substrate bonding system BS discussed with reference to FIGS. 1 to 5. The substrate bonding method S may include a step S1 of plasma-treating a first substrate, a step S2 of cleaning the first substrate, and a step S3 of bonding a second substrate onto the first substrate.

The plasma treatment step (step S1) may include a step S11 of loading the first substrate on a plasma processing apparatus, a step S12 of supplying the plasma processing apparatus with H$_2$O, a step S13 of supplying a process gas onto the first substrate, and a step S14 of generating plasma on the first substrate.

The cleaning step (step S2) may include a step S21 of supplying a cleaning solution onto the first substrate, and a step S22 of rotating the first substrate.

The bonding step (step S3) may include a step S31 of placing the first substrate on a lower chuck, a step S32 of placing a second substrate on an upper chuck, and a step S33 of allowing the second substrate to contact a top surface of the first substrate.

FIGS. 7 to 14 illustrate cross-sectional views showing a substrate bonding method according to the flow chart of FIG. 6.

Figure 7:
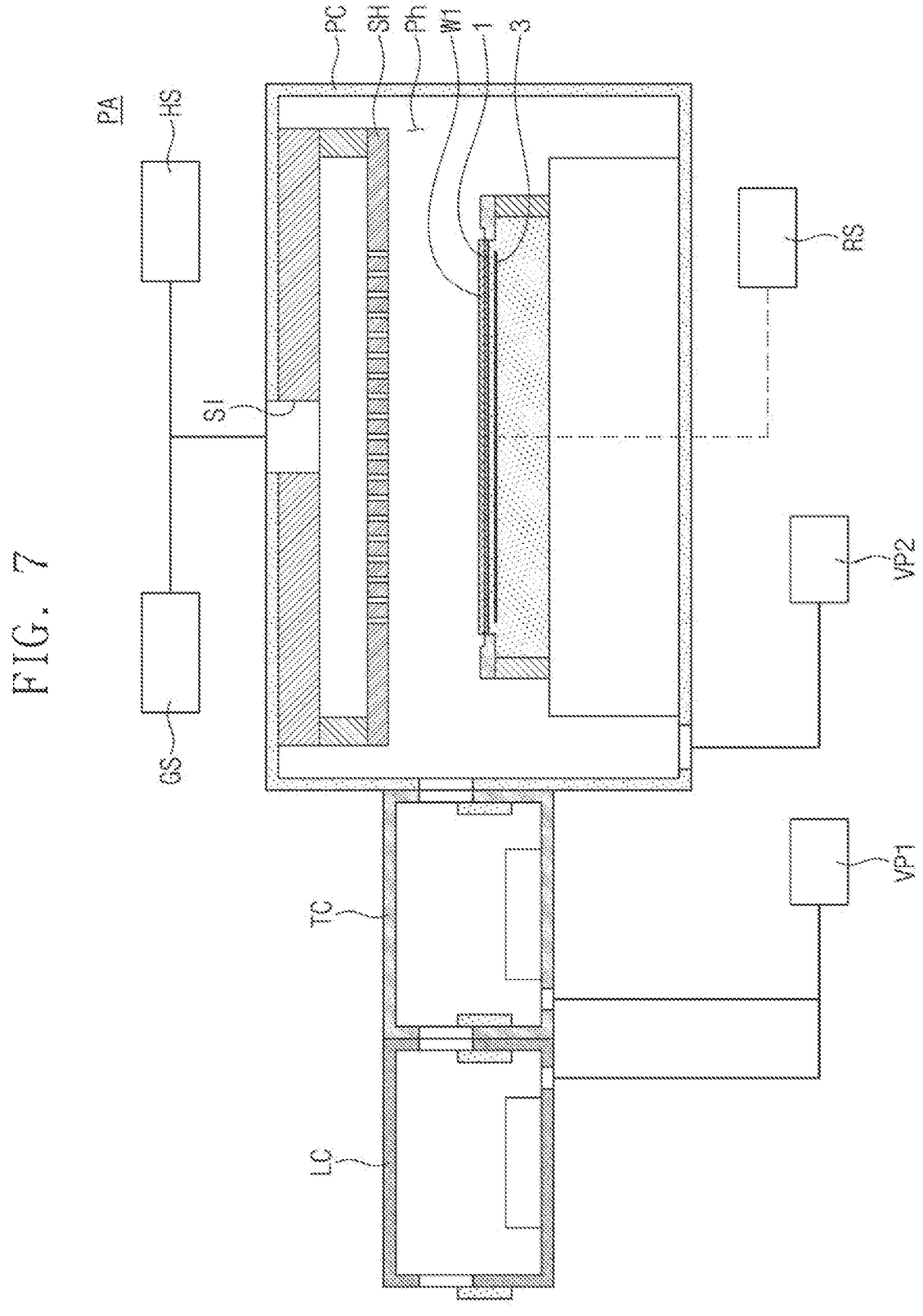
FIG. 7 illustrates a first cross-sectional view showing a substrate bonding method according to the flow chart of FIG. 6.

Referring to FIGS. 6 and 7, the substrate loading step (step S11) may include placing a first substrate W1 into the load-lock chamber LC. For example, when a one-side door of the load-lock chamber LC is opened, the load-lock chamber LC may receive the first substrate W1 from the outside.

The substrate loading step (step S11) may further include applying a vacuum pressure to the load-lock chamber LC. For example, when the first substrate W1 is disposed in the load-lock chamber LC, the one-side door may be closed and the first vacuum pump VP1 may apply a vacuum pressure to the load-lock chamber LC. Therefore, the load-lock chamber LC may have a vacuum state therein.

The substrate loading step (step S11) may further include transferring the first substrate W1 from the load-lock chamber LC to the plasma process chamber PC. For example, an another-side door of the load-lock chamber LC in the vacuum state may be opened to allow the transfer device TC to transfer the first substrate W1 from the load-lock chamber LC to the plasma process chamber PC. In this step, the plasma process chamber PC may have a vacuum state therein. For example, the process space Ph may have a vacuum state prior to the transfers of the first substrate W1. The vacuum state of the process space Ph may be maintained by the second vacuum pump VP2.

The substrate loading step (step S11) may further include placing the first substrate W1 onto the chuck 1. The first substrate W1 may be fixed onto the chuck 1.

Figure 8:
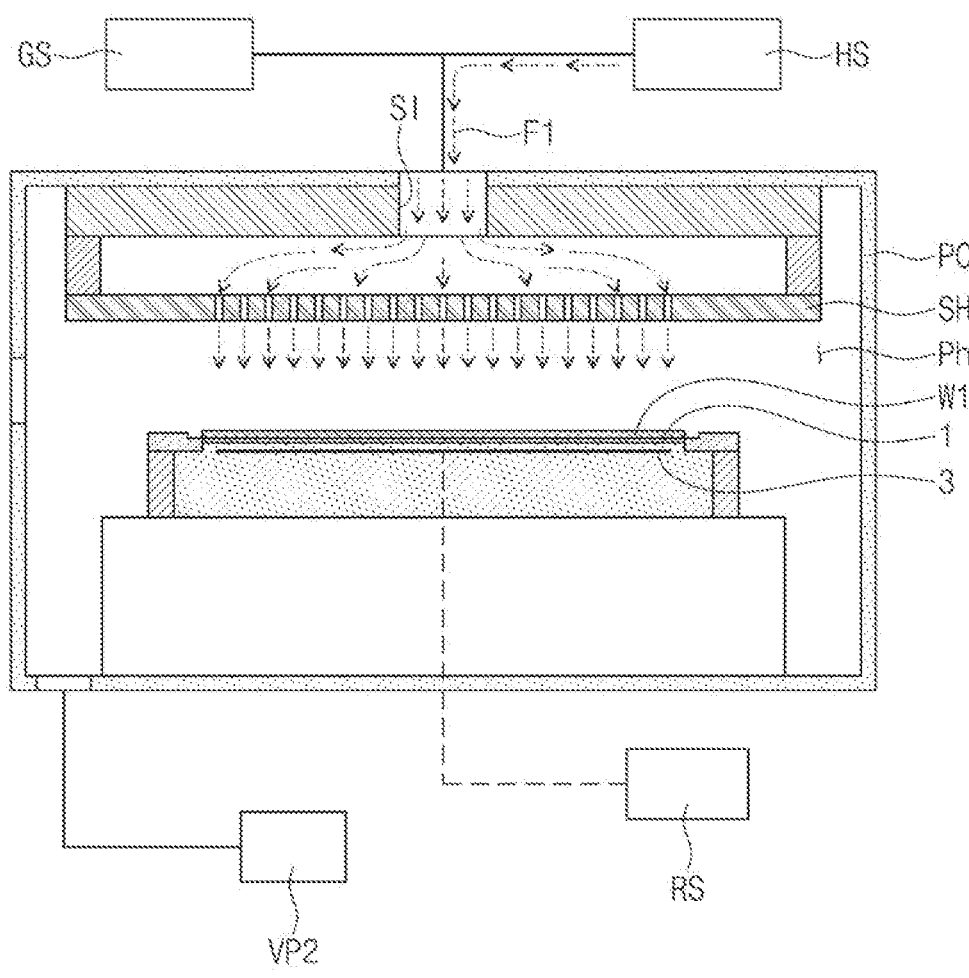
FIG. 8 illustrates a second cross-sectional view showing the substrate bonding method according to the flow chart of FIG. 6.

Referring to FIGS. 6 and 8, the H$_2$O supply step (step S12) may include allowing the H$_2$O supply HS to supply the process space Ph with H$_2$O. When supplying H$_2$O in a state being included in air, the process space Ph may be supplied with air F1. For example, the air F1 introduced through the fluid intake SI may be distributed through the showerhead SH to the process space Ph. A portion of H$_2$O in the air F1 may be in contact with a top surface of the first substrate W1. In addition, another portion of H$_2$O may be in contact with a different component in the plasma process chamber PC.

Figure 9:
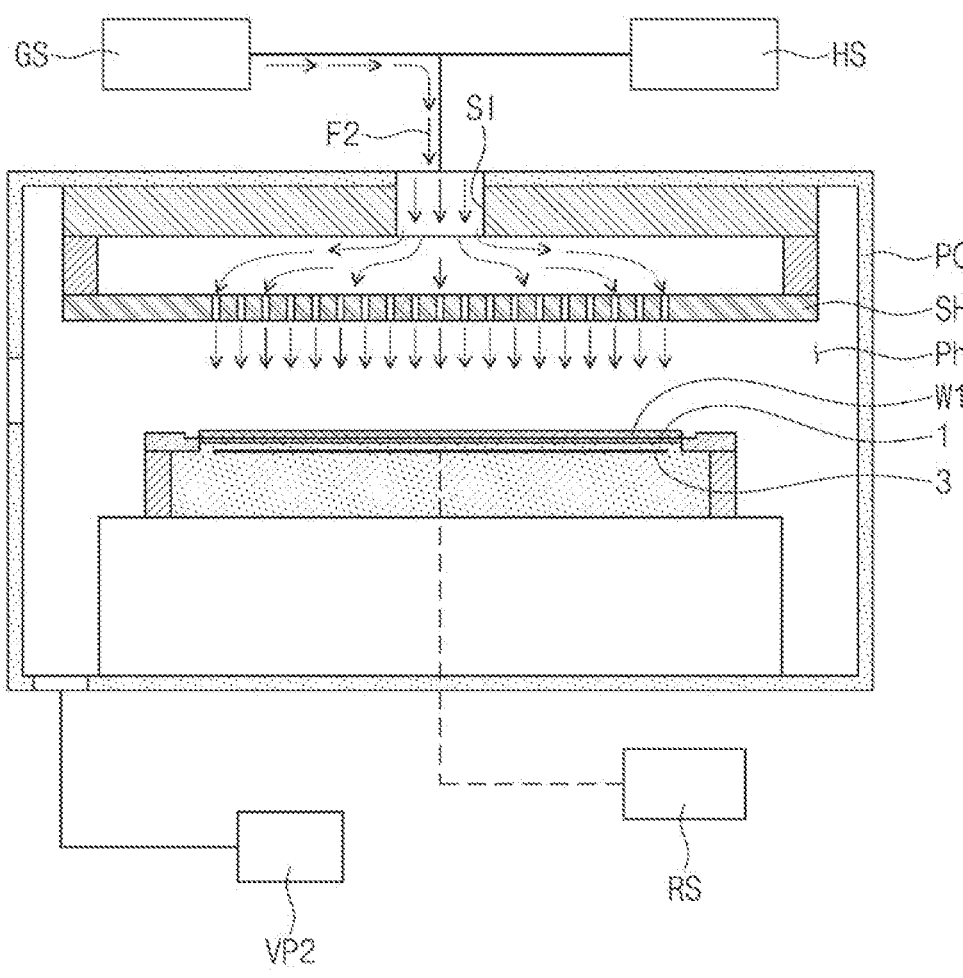
FIG. 9 illustrates a third cross-sectional view showing the substrate bonding method according to the flow chart of FIG. 6.

Referring to FIGS. 6 and 9, the process gas supply step (step S13) may include allowing the process gas supply GS to supply the process space Ph with a process gas F2. For example, the process gas F2 introduced through the fluid intake SI may be distributed through the showerhead SH to the process space Ph.

Figure 10:
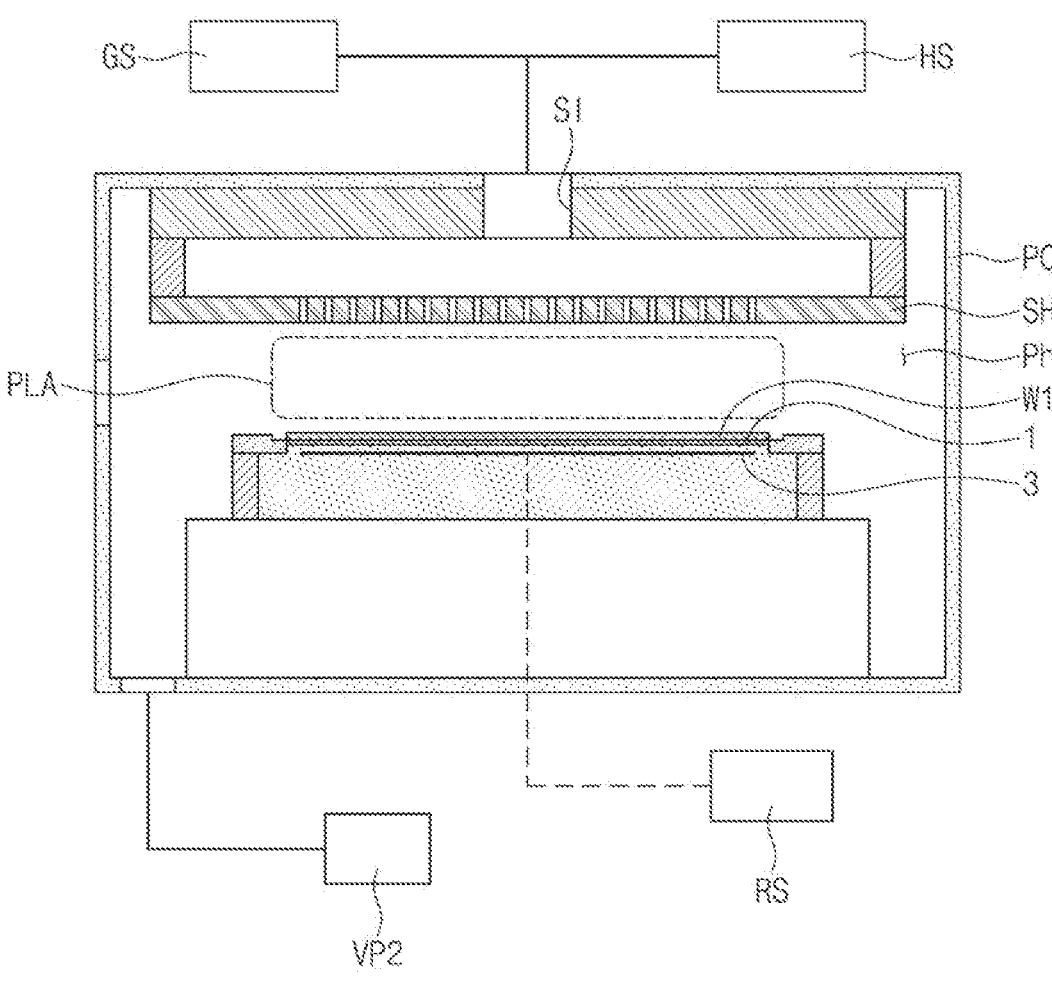
FIG. 10 illustrates a fourth cross-sectional view showing the substrate bonding method according to the flow chart of FIG. 6.

Referring to FIGS. 6 and 10, the plasma generation step (step S14) may include allowing the process space Ph to have an electric field formed with a radio-frequency (RF) power that the RF power apply unit RS applies to the plasma electrode 3. The electric field may convert the process gas F2 in the process space Ph into plasma PLA. A surface of the first substrate W1 may be treated with the plasma PLA. For example, under an environment in which $H_2O$ is present, the plasma treatment may generate a hydroxyl group (—OH) on the top surface of the first substrate W1. When the plasma treatment is completed, the first substrate W1 may be transferred from the plasma process chamber PC to the cleaning chamber (see cleaning chamber CC of FIG. 11).

It is shown and described that the $H_2O$ supply step (step S12) is preceded by the substrate loading step (step S11), but embodiments of the present disclosure are not limited thereto. For example, the $H_2O$ supply step (step S12) may be followed by the substrate loading step (step S11). In addition, when the $H_2O$ supply step (step S12) is performed one time, a plurality of substrates may undergo a plasma treatment process. For example, when a plasma processing apparatus is supplied once with $H_2O$, the plasma treatment process may be repeatedly performed a plurality of times. For more detail, when the plasma processing apparatus is supplied once with $H_2O$, the plasma treatment process may be performed ten times without being resupplied with $H_2O$.

Figure 11:
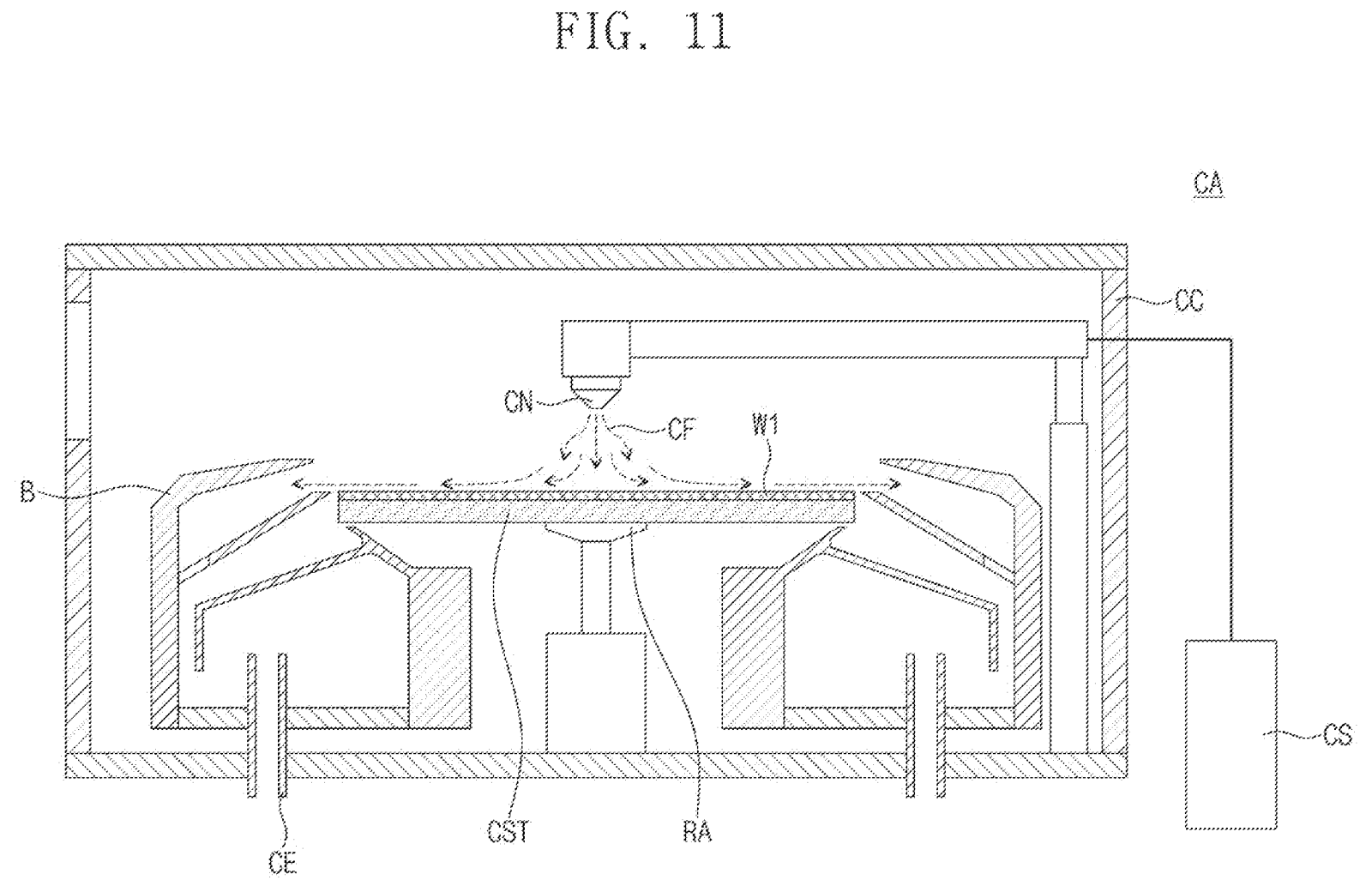

Referring to FIGS. 6 and 11, the cleaning solution supply step (step S21) may include spraying a cleaning solution CF onto the first substrate W1 disposed on the stage CST. For example, the cleaning solution CF supplied from the cleaning solution supply CS may be injected through the cleaning nozzle CN onto the top surface of the first substrate W1.

The substrate rotation step (step S22) may include allowing the rotational drive mechanism RA to rotate the first substrate W1 in place. Therefore, the cleaning solution CF injected onto the top surface of the first substrate W1 may be thrown outwardly by centrifugal force. The thrown cleaning solution may be collected by the bowl B and then may be discharged through the cleaning exhaust CE. In this procedure, the top surface of the first substrate W1 may be cleaned. When the cleaning treatment is completed, the first substrate W1 may be transferred from the cleaning chamber CC to the bonding chamber (see bonding chamber BC of FIG. 12).

Figure 12:
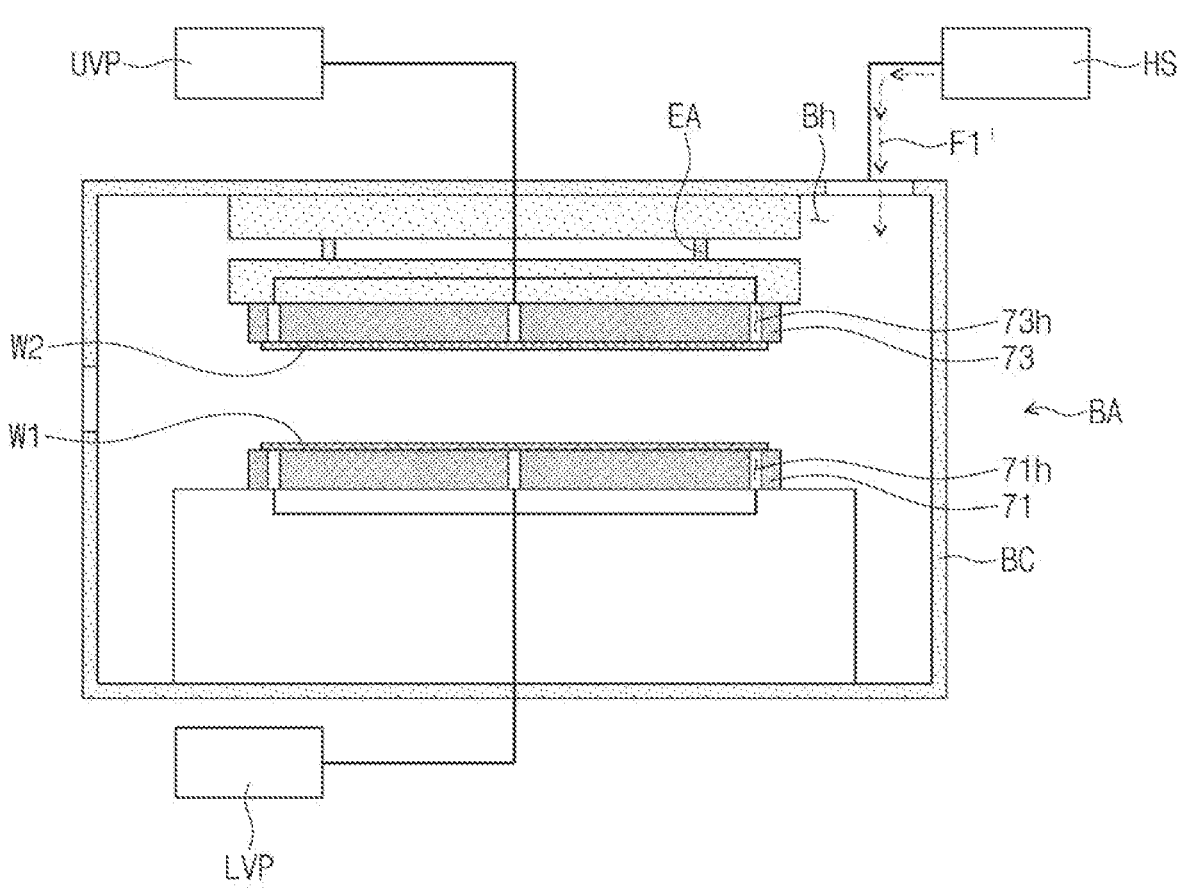
FIG. 12 illustrates a sixth cross-sectional view showing the substrate bonding method according to the flow chart of FIG. 6.

Referring to FIGS. 6 and 12, the first substrate placement step (step S31) may include fixing the first substrate W1 onto the lower chuck 71. The first substrate W1 may be in a state that has passed through the plasma processing apparatus (see plasma processing apparatus PA of FIG. 2) and the cleaning apparatus (see cleaning apparatus CA of FIG. 4). A vacuum pressure provided to the lower vacuum hole 71h may fix the first substrate W1 onto the lower chuck 71.

The second substrate placement step (step S32) may include fixing a second substrate W2 onto the upper chuck 73. The second substrate W2 may be in a state that has passed through the plasma processing apparatus (see plasma processing apparatus PA of FIG. 2) and the cleaning apparatus (see cleaning apparatus CA of FIG. 4). Alternatively, unlike the first substrate W1, the second substrate W2 may not have experienced any of the plasma treatment and the cleaning treatment. A vacuum pressure provided to the upper vacuum hole 73h may fix the second substrate W2 onto the upper chuck 73.

In this procedure, air F1' may be supplied from the $H_2O$ supply HS to the bonding apparatus BA. For example, the air F1' may be supplied to the bonding space Bh from the air supply device (see air supply device 51 of FIG. 3) of the $H_2O$ supply HS. Therefore, it may be possible to control temperature and humidity in the bonding chamber BC.

Figure 13:
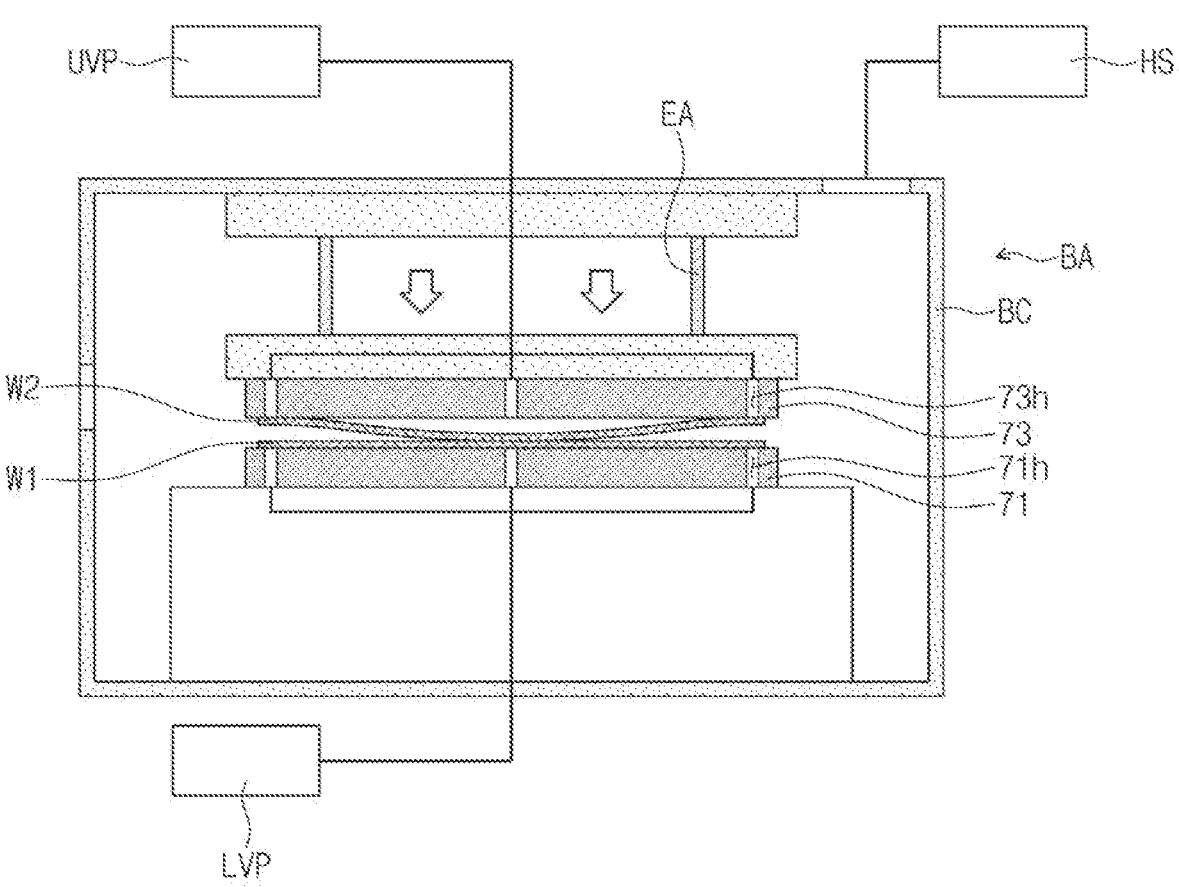
FIG. 13 illustrates a seventh cross-sectional view showing the substrate bonding method according to the flow chart of FIG. 6.

Referring to FIGS. 6 and 13, the substrate contact step (step S33) may include approaching the lower chuck 71 and the upper chuck 73 to each other to allow the second substrate W2 to contact the top surface of the first substrate W1. For example, the chuck elevation device EA may descend the upper chuck 73. In this procedure, a vacuum pressure may be released from one or more of a plurality of the upper vacuum hole 73h of the upper chuck 73. For example, as illustrated in FIG. 13, a vacuum pressure may be released from a centrally positioned one of the plurality of the upper vacuum hole 73h. Therefore, a central portion of the second substrate W2 may sag downwardly to first contact the top surface of the first substrate W1.

Figure 14:
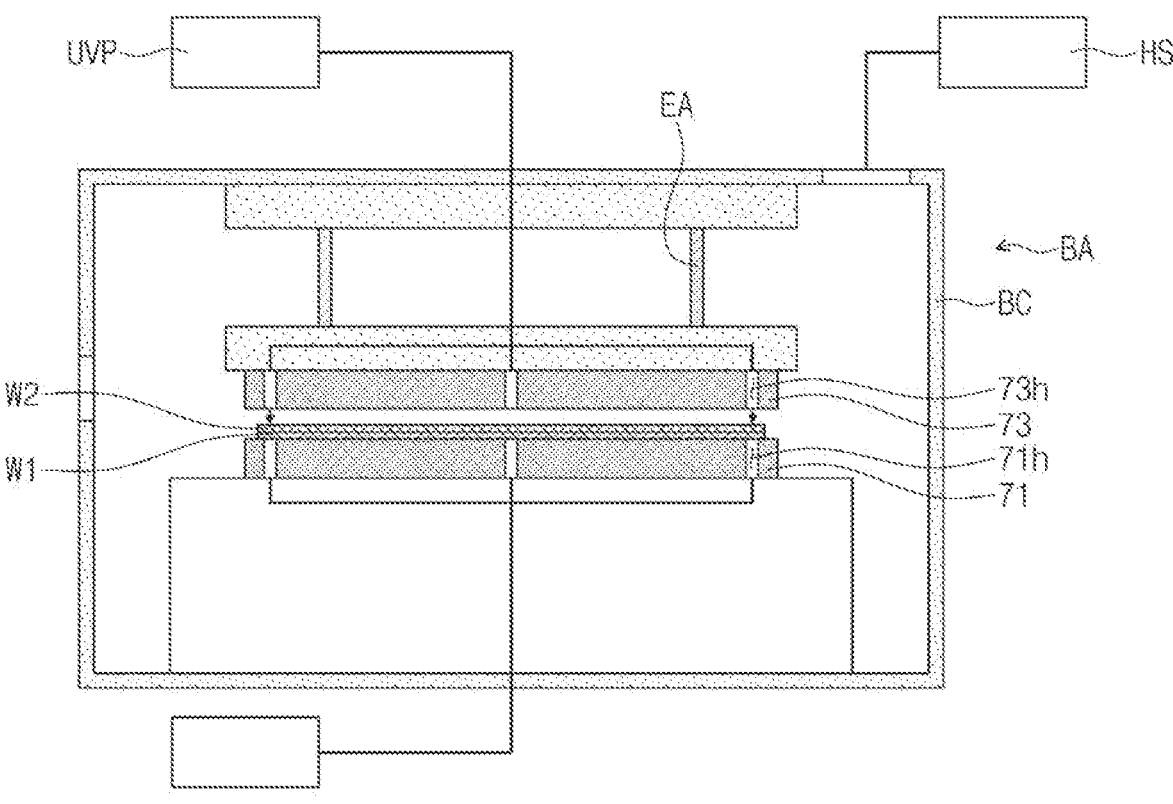
FIG. 14 illustrates an eighth cross-sectional view showing the substrate bonding method according to the flow chart of FIG. 6.

Referring to FIG. 14, a vacuum pressure may be released from the remainder of the plurality of the upper vacuum hole 73h. Thus, the second substrate W2 may be separated from the upper chuck 73 to completely contact the top surface of the first substrate W1. Therefore, a direct bonding may be achieved between the first substrate W1 and the second substrate W2. The first substrate W1 and the second substrate W2, that are bonded together, may be unloaded from the bonding chamber BC. Afterwards, the first substrate W1 and the second substrate W2, that are bonded together, may be heated to accomplish a complete bonding between the first substrate W1 and the second substrate W2.

According to a plasma processing apparatus, a substrate bonding system including the same, and a substrate bonding method using the same in accordance with some embodiments of the present disclosure, a plasma process chamber may be maintained in its vacuum state. For example, when a substrate is loaded and/or unloaded, a load-lock chamber may be used to prevent release of a vacuum from the plasma process chamber. Therefore, there may be a reduction in time required for creating a vacuum environment. Accordingly, it may be possible to save a total process time.

According to a plasma processing apparatus, a substrate bonding system including the same, and a substrate bonding method using the same in accordance with some embodiments of the present disclosure, before a direct bonding process, a plasma treatment may be performed to form a hydroxyl group (—OH) on a surface of a substrate. In this step, $H_2O$ may be separately supplied to a plasma process chamber, and thus the hydroxyl group (—OH) may be sufficiently formed on the surface of the substrate. As the plasma process chamber is separately supplied with $H_2O$, a shortage of $H_2O$ may be prevented even when the plasma process chamber is maintained in its vacuum state. Therefore, a bonding force may be increased in a bonding process.

According to a plasma processing apparatus, a substrate bonding system including the same, and a substrate bonding method using the same in accordance with some embodiments of the present disclosure, $H_2O$ in a state being included in air may be supplied by using a temperature humidity air controller (THC) typically used for a bonding chamber. Thus, a separate supply apparatus for supplying $H_2O$ to a plasma process chamber may not be required. Accordingly, it may be possible to cut cost and to simplify equipment.

According to a plasma processing apparatus, a substrate bonding system including the same, and a substrate bonding method using the same in accordance with some embodiments of the present disclosure, a cleaning apparatus may be used to clean a substrate. Therefore, foreign substances may be prevented in advance to increase a yield of substrate bonding process.

According to a plasma processing apparatus, a substrate bonding system including the same, and a substrate bonding method using the same in accordance with some embodiments of the present disclosure, $H_2O$ may be supplied before a substrate is disposed for plasma treatment. In addition, when a supply amount of $H_2O$ is controlled, a plasma treatment process may be performed a plurality of times with a one-time supply of $H_2O$. For example, a great amount of $H_2O$ supplied at one time may be accommodated by being attached to other components in a plasma process chamber. Such $H_2O$ may be used to produce a hydroxyl group (—OH) in a subsequent plasma treatment process. Therefore, it may be possible to minimize a time required for supplying $H_2O$.

According to a plasma processing apparatus, a substrate bonding system including the same, and a substrate bonding method using the same in accordance with some embodiments of the present disclosure, a vacuum state of a chamber may be maintained to reduce a process time.

According to a plasma processing apparatus, a substrate bonding system including the same, and a substrate bonding method using the same in accordance with some embodiments of the present disclosure, it may be possible to increase bonding efficiency between substrates.

According to a plasma processing apparatus, a substrate bonding system including the same, and a substrate bonding method using the same in accordance with some embodiments of the present disclosure, it may be possible to cut cost.

Effects of embodiments of the present disclosure are not limited to the mentioned above, and other effects which have not been mentioned above will be clearly understood to those skilled in the art from the above description.

Although non-limiting example embodiments of the present disclosure have been described in connection with the embodiments illustrated in the accompanying drawings, it will be understood to those skilled in the art that various changes and modifications may be made without departing from the technical spirit of the present disclosure. It therefore will be understood that the embodiments described above are illustrative and are not limitative in all aspects.

What is claimed is:

1. A plasma processing apparatus configured to perform a plasma treatment process on a substrate, the plasma processing apparatus comprising:
   a plasma process chamber that comprises a process space;
   a load-lock chamber connected to the process space;
   a first vacuum pump configured to adjust a pressure of the load-lock chamber;
   a second vacuum pump configured to adjust a pressure of the process space;
   a process gas supply configured to supply the process space with a process gas; and
   an $H_2O$ supply configured to supply $H_2O$ into the process space in a vacuum state, before the substrate is disposed into the process space,
   wherein the plasma process chamber comprises:
      a chuck configured to support the substrate; and
      a plasma electrode to which a radio-frequency (RF) power is configured to be applied, wherein the plasma electrode is configured to convert the process gas into plasma, wherein the $H_2O$ supply comprises an air supply that stores air, wherein the air that is stored in the air supply includes the $H_2O$,
   wherein the air supply is a temperature humidity air controller that is configured to adjust temperature and humidity of the air,
   wherein the plasma process chamber is configured to perform the plasma treatment process by a portion of the H2O included in the air contacting the substrate and by the plasma electrode converting the process gas into the plasma, and
   wherein the plasma treatment process is configured to generate hydroxyl groups on the substrate.

2. The plasma processing apparatus of claim 1, wherein the $H_2O$ supply further comprises:
   an air pipe that connects the air supply and the plasma process chamber to each other; and
   a flow controller on the air pipe, the flow controller configured to control a flow rate of the air in the air pipe.

3. The plasma processing apparatus of claim 2, wherein the $H_2O$ supply further comprises a filter on the air pipe, the filter configured to filter foreign substances inside the air that is supplied through the air pipe.

4. The plasma processing apparatus of claim 2, wherein the $H_2O$ supply further comprises:
   a regulator on the air pipe, the regulator configured to control a pressure of the air that is supplied to the plasma process chamber; and
   a pressure sensor configured to detect a pressure of the air in the air pipe.

5. The plasma processing apparatus of claim 1, further comprising a showerhead upwardly spaced apart from the chuck,
   wherein the showerhead is configured to supply the $H_2O$ onto the chuck from the $H_2O$ supply.

6. The plasma processing apparatus of claim 1, further comprising a transfer device between the load-lock chamber and the plasma process chamber,
   wherein the transfer device comprises a robot arm and is configured to transfer the substrate in the load-lock chamber to the plasma process chamber.

7. The plasma processing apparatus of claim 1, wherein the air supply comprises an air tank that stores the air that includes the H2O.

8. The plasma processing apparatus of claim 1, wherein the $H_2O$ supply further comprises an air pipe that connects the air supply and the plasma process chamber to each other, and
   wherein the air pipe is configured to provide the air, which includes the $H_2O$, from the air supply to the plasma process chamber.

\* \* \* \* \*